United States Patent [19]
Kim et al.

[11] Patent Number: 5,326,999
[45] Date of Patent: Jul. 5, 1994

[54] NON-VOLATILE SEMICONDUCTOR MEMORY DEVICE AND MANUFACTURING METHOD THEREOF

[75] Inventors: Keon-soo Kim, Kyungki-do; Hyung-kyu Lim, Seoul, both of Rep. of Korea

[73] Assignee: Samsung Electronics, Co., Ltd., Suwon, Rep. of Korea

[21] Appl. No.: 976,200

[22] Filed: Nov. 13, 1992

[30] Foreign Application Priority Data

Nov. 19, 1991 [KR] Rep. of Korea ............... 91-20632

[51] Int. Cl.⁵ .................. H01L 29/68; G11C 11/34
[52] U.S. Cl. ........................... 275/315; 257/316; 257/321; 257/773; 257/774; 365/185
[58] Field of Search ............ 257/315, 321, 316, 344, 257/411, 412, 413, 499, 773, 774; 365/185

[56] References Cited

U.S. PATENT DOCUMENTS 5,200,636 4/1993 Uemura et al. ............... 257/315

Primary Examiner—Mark V. Prenty
Attorney, Agent, or Firm—Robert A. Westerlund; Charles R. Donohoe

[57] ABSTRACT

Disclosed is a non-volatile semiconductor memory device and the manufacturing method thereof. The non-volatile semiconductor memory device comprising a semiconductor substrate, and a group of gates electrically isolated from each other and formed on the semiconductor substrate, wherein the group of gates comprises a floating gate formed with a first conductive layer, a control gate formed with a second conductive layer laminated on the floating gate and select gates formed with the first conductive layer and the second conductive layer/formed on both the opposite side of the floating gate and the control gate and with an interposing impurity diffusion region formed on the semiconductor substrate, and wherein the select gates formed with the first conductive layer and the second conductive layer forms contacts on a field oxidation layer, thereby being connected with each other. The gate of the select transistor is formed as a first conductive layer by a self-aligned etching process and a butted contact process. Meanwhile, prior to forming a tunnel oxidized film, a buried n⁻ layer is formed on a tunnel region pattern so as to be self-aligned, thereby reducing a distance between the select transistor and the storage transistor to within photolithographic processing limits so as to realize the high-integration of the EEPROM.

14 Claims, 9 Drawing Sheets

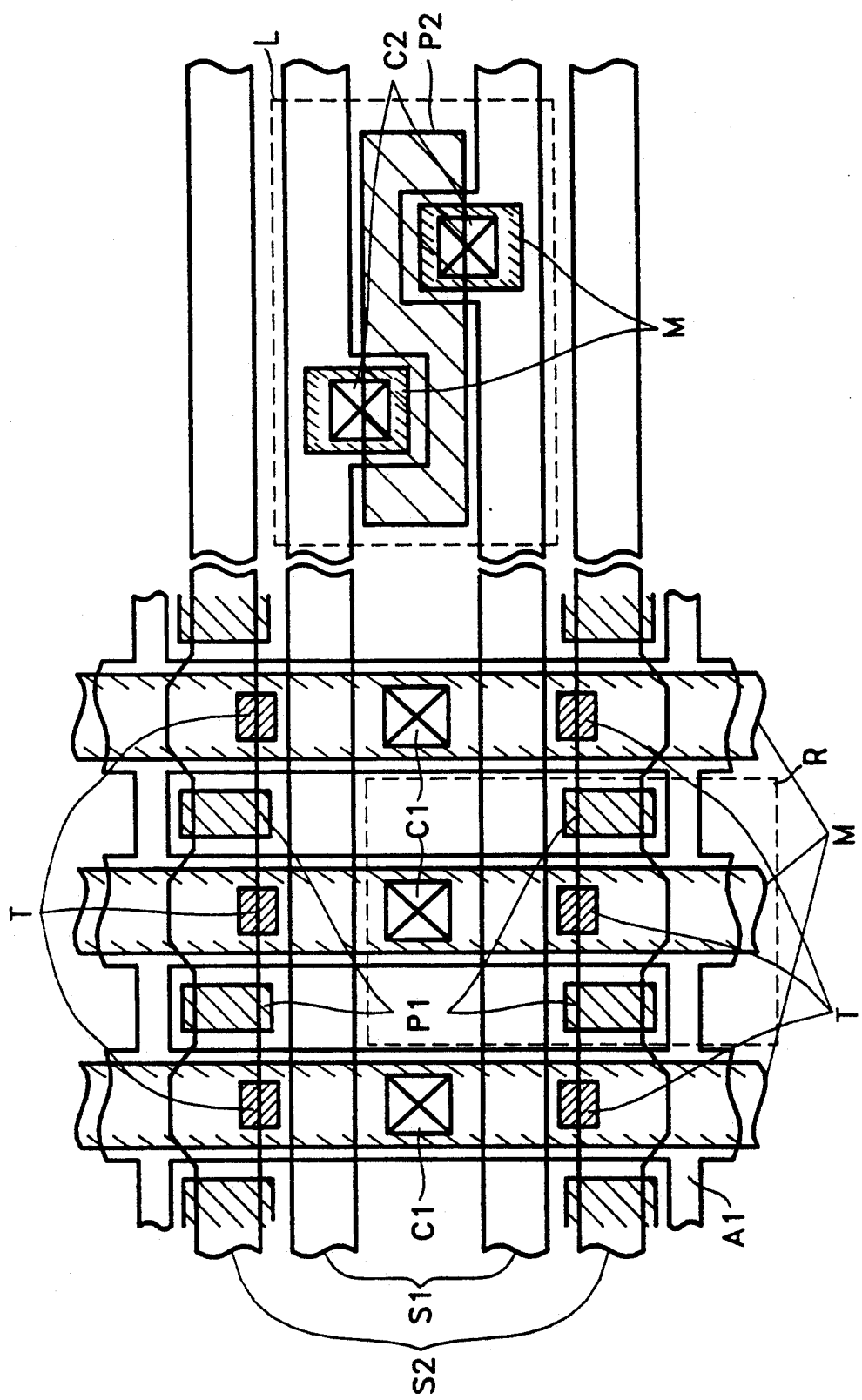

NON-VOLATILE SEMICONDUCTOR MEMORY DEVICE AND MANUFACTURING METHOD THEREOF

BACKGROUND OF THE INVENTION

The present invention relates to a non-volatile semiconductor memory device and a manufacturing method thereof, and more particularly, to a non-volatile semiconductor memory device having a selective transistor having a butted contact structure and a manufacturing method thereof.

In data processing systems, the information storage apparatus is of much significance. The semiconductor memory devices are classified into a volatile memory device which loses the contents of the memory if power is not supplied and a non-volatile memory device which holds the contents even without a supplied power. However, non-volatile memory devices have limited application because its contents cannot be easily altered, as well as having other operational difficulties.

However, non-volatile memory devices adopting a MOS floating-gate structure have been widely used. Such devices utilize floating gates made of conductive material which is electrically isolated from the semiconductor substrate. Here, since the gate is capacitively coupled with the semiconductor substrate, it forms a MOS transistor for sensing the charged state of the floating gate. The MOS transistor is in either a conduction state ("ON") or a non-conduction state ("OFF") according to the presence or absence of floating gate charges, so as to store logic bits "1" or "0". As the mechanism for applying such charges to the floating gate, and their removal, hot electrons produced by avalanche breakdown and tunnelling effects have been used.

Among such non-volatile semiconductor memory devices, demand has increased for electrically erasable & programmable read only memories (EEPROMs) which electrically store and erase the data.

The structure of the conventional EEPROM cell, as disclosed in "ISSCC 82, National Semiconductor" (page 108, 1982) and "IEEE Electron Devices" (page 1178, 1982) is described below with reference to FIGS. 1 and 2. Here, FIG. 1 shows a planar structure of the cell and FIG. 2 shows a vertical structure of the cell.

The cell of the EEPROM in which two transistors form a single cell (shown as a dotted line in FIG. 1). comprises a select transistor 3 which is used for selecting the cell and a storage transistor 4 which plays the roll of storing electrons in a floating gate. As shown in FIG. 2, in the cell structure of the conventional EEPROM, the gate of the select transistor is formed as a second conductive layer for forming a control gate which is formed on the floating gate of the storage transistor composed of a first conductive layer. Also, a buried N+ layer 5 is formed below a tunnel oxidation film 2 which causes tunnelling to occur when the programmed data is erased.

Operation of the EEPROM cell formed as above is described below with reference to an equivalent circuit diagram of the cell shown in FIG. 3.

When the programming of the cell is erased, a high voltage of 15 V to 20 V is applied to a control gate C/G of storage transistor 4, and a proper voltage is applied to a select gate S/G of select transistor 3. By doing so, if a bit line voltage of 0 V is applied to the buried N+ region, the electrons are charged in the floating gate by means of tunnelling electrons resulting from the strong electric field between the floating gate and the buried N+ region.

Cell programming is performed as a result of the tunnelling of the electrons of the floating gate due to high voltage applied to the buried N+ region by applying 0 V to control gate C/G and applying a high voltage of 10 V to 20 V to the bit line and select gate S/G of the select transistor.

By repeating an operation such as that described above, the cell in which data is programmed or erased is read by a sensing amplifier for sensing the current passing through the bit line according to the presence or absence of the electrons in the floating gate, with 1-3 V applied to the bit line, Vcc supplied to the select gate and 2-3 V applied to the control gate.

As described above, for EEPROM cell programming, since high voltage is applied to the bit line, two transistors constitute a single cell and a tunnelling region is required, the application of such cells is difficult in high integration density. Here, the limitation of cell integration is primarily due to the tunnelling region being formed inside the floating gate. Another limiting factor is that the buried N+ region must be formed so as to match the tunnelling region. Since the gate of the select transistor is formed of the second conductive layer, the floating gate of the storage transistor is formed of the first conductive layer. Thereafter, when the gate of the select transistor and the control gate of the storage transistor are formed of the second conductive layer, the etching process of the second conductive layer should be taken into consideration. Accordingly, the distance between the select transistor and the storage transistor increases beyond the photolithography limitations, which also leads to difficulty in realizing high integration. Also, the floating gate formed of the first conductive layer is misaligned with the control gate formed of the second conductive layer.

SUMMARY OF THE INVENTION

Therefore, to solve the above problems, it is an object of the present invention to provide a non-volatile semiconductor memory device capable of accomplishing a high integration.

It is another object of the present invention to provide a manufacturing method adapted to manufacture a non-volatile semiconductor memory device.

To accomplish the above object of the present invention, there is provided a non-volatile semiconductor memory device comprising: a semiconductor substrate, and a group of gates electrically isolated from each other and formed on the semiconductor substrate, wherein the group of gates comprises a floating gate formed of a first conductive layer, a control gate formed of a second conductive layer laminated on the floating gate and select gates formed of the first conductive layer and the second conductive layer formed on both the opposite side of the floating gate and the control gate and with an interposing impurity diffusion region formed on the semiconductor substrate, and wherein the select gates formed of the first conductive layer and the second conductive layer forms contacts on a field oxidation layer.

To accomplish another object of the present invention, there is provided a method for manufacturing a non-volatile semiconductor memory device comprising the steps of:

forming a field oxidation layer for separating a cell through a selective oxidation on a P-type semiconductor substrate;

forming a gate oxidation film and performing an ion injection on a tunnel region of a storage transistor;

after forming a tunnel oxidation film on the tunnel region, sequentially forming a first conductive layer pattern and laminating an insulation layer and a second conductive layer on the whole surface of the resulting structure;

etching the second conductive layer, the insulation layer and the first conductive layer pattern, by applying a photomask to define the gates of a select transistor and a storage transistor;

etching the second conductive layer corresponding to portions to become butted contacts of the gate of the select transistor;

selectively ion-injecting n-type impurities in the drain region of the storage transistor;

forming a source/drain region by injecting n-type impurities on the semiconductor substrate on which the gates of both the select transistor and the storage transistor are formed;

forming an intermediate insulation film and metal contact hole by applying a metal contact mask to define a metal contact, and simultaneously forming a butted contact region by applying the contact mask to define the butted contact region of the gate of the select transistor; and forming a metal wire by depositing metal and simultaneously forming the butted contact of the gate of the select transistor.

BRIEF DESCRIPTION OF THE DRAWINGS

The above object and other advantages of the present invention will become more apparent by describing in detail a preferred embodiment of the present invention with reference to the attached drawings in which:

FIG. 5 is a plan view showing part of a EEPROM cell array according to the present invention;

DETAILED DESCRIPTION OF THE INVENTION

The present invention will be described below with reference to the accompanying drawings.

Figure 1:
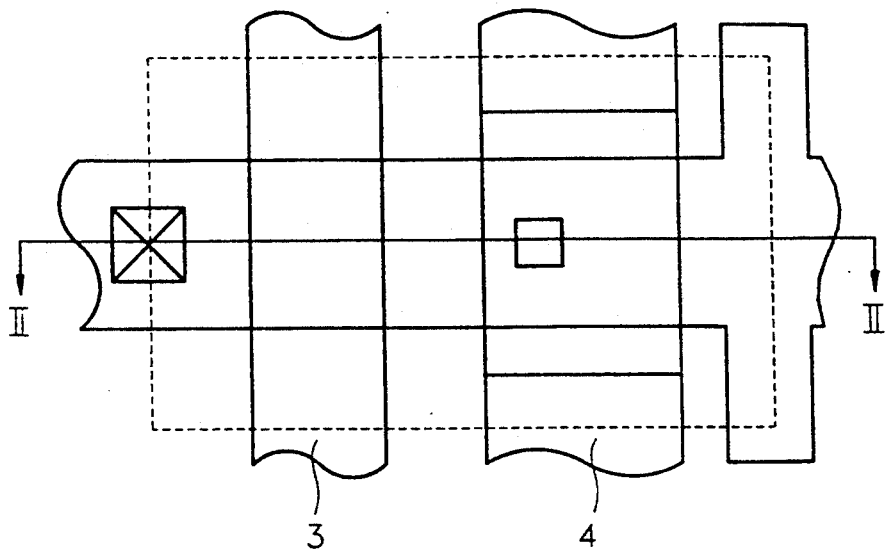
FIG. 1 is a plan view of the conventional EEPROM cell.
Figure 2:
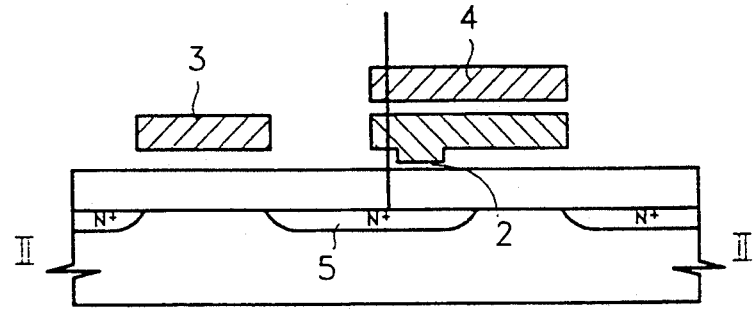
FIG. 2 is a vertical cross-sectional view of the conventional EEPROM cell cut along line II—II in FIG. 1.
Figure 3:
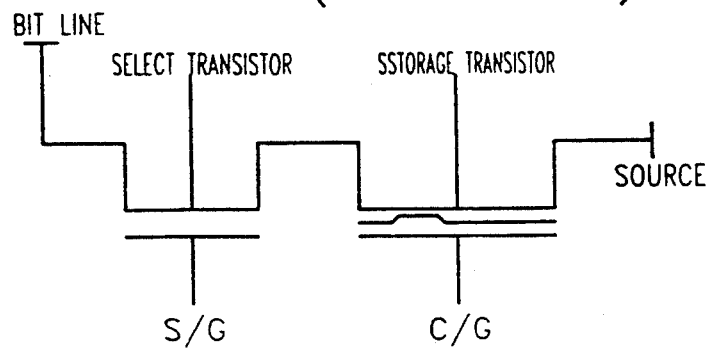
FIG. 3 is an equivalent circuit diagram of the conventional EEPROM cell shown in FIG. 1.
Figure 4:
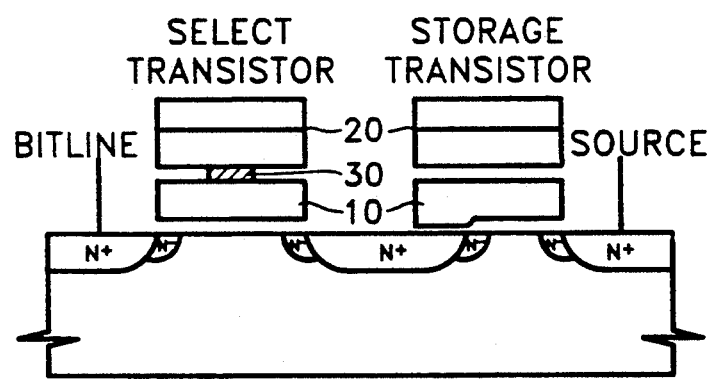
FIG. 4 is a shematic vertical cross-sectional view of a EEPROM cell according to the present invention.

In FIG. 4, select transistor gates have a laminated structure in which first conductive layer 10 and second conductive layer 20 are formed as a butted contact 30.

In FIG. 5, a reference symbol A1 represents an active region, C1 and C2 represent contact holes, and T represents a tunnel region of the storage transistor. Also, reference symbol M represents a metal wire, S1 and S2 represent the gates of the select transistor and storage transistor, respectively, P1 represents an etched portion in the first conductive layer forming the gate of the select transistor and the floating gate of the storage transistor, and P2 represents an etched portion in the second conductive layer forming the gate of the select transistor.

Figure 6A:
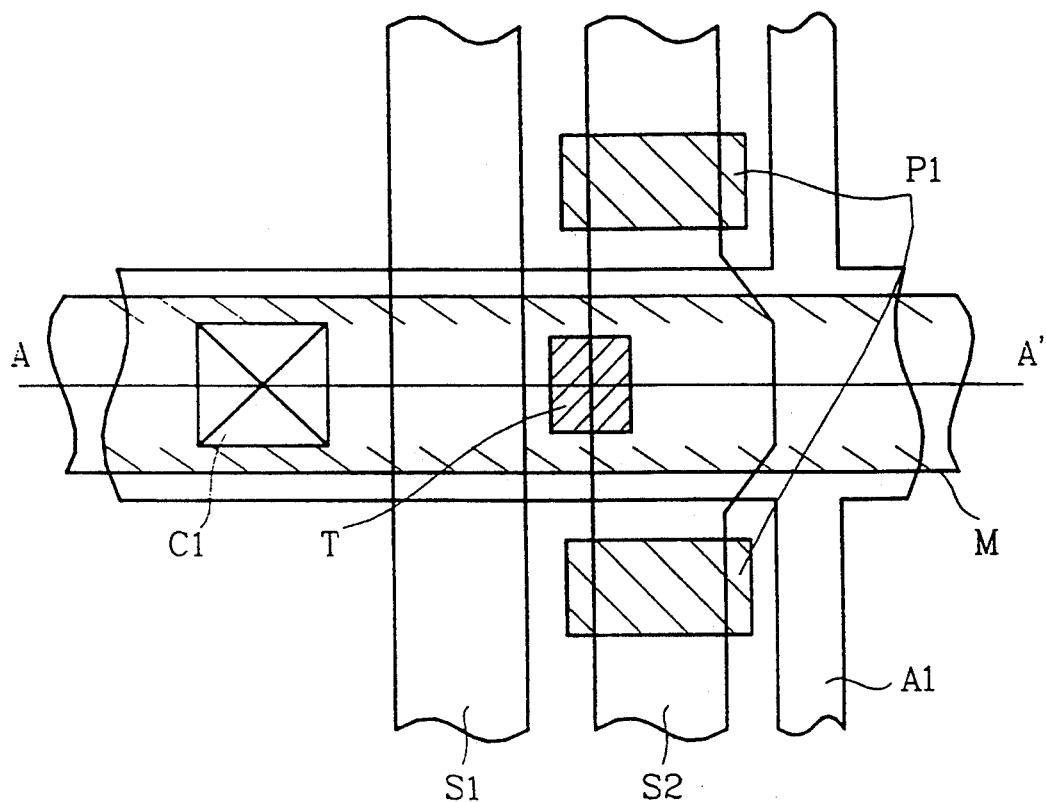
FIGS. 6A and 6B are an enlarged plan view and a cross-sectional view showing one cell shown in FIG. 5, respectively.
Figure 6B:
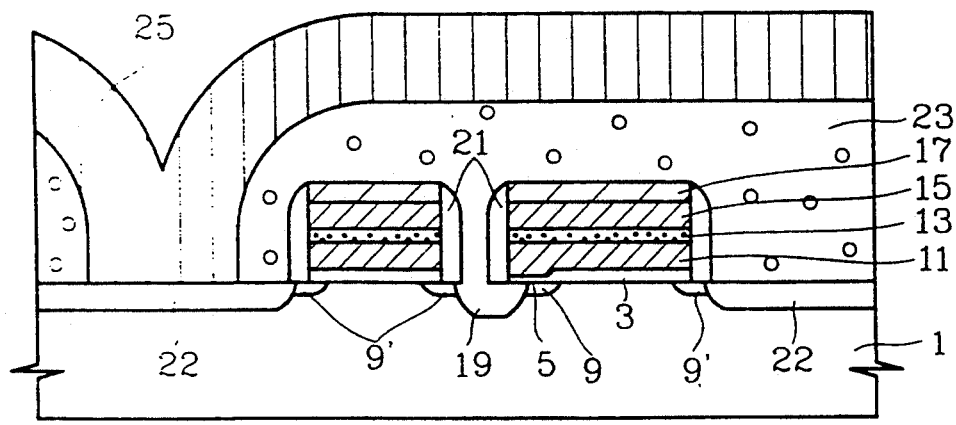

FIG. 6A shows an enlarged view of a portion R defined with a dotted line on the left side of FIG. 5, and FIG. 6B shows a cross-sectional view taken along a line A—A' of FIG. 6A.

The manufacturing method for realizing a structure of the EEPROM cell of FIG. 6B will be described below with reference to FIGS. 7A through 7D in accordance with various manufacturing processes.

Figure 7A:
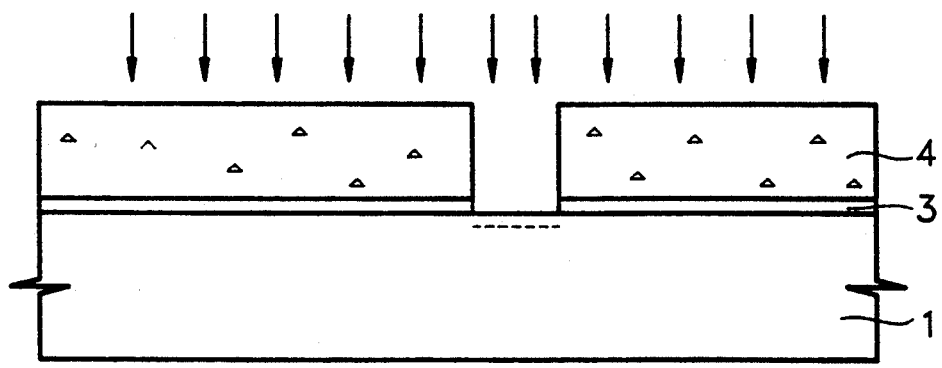
FIGS. 7A through 7D are cross-sectional views showing a procedure for manufacturing the EEPROM cell according to the present invention.

First, referring to FIG. 7A, gate oxidation film 3 is formed with a thickness of 200 Å to 500 Å on P-type silicon substrate 1. Then, to form a tunnel region of the storage transistor, photoresist pattern 4 is formed by way of a photolithographic process. Photoresist pattern 4 functions as a mask, to remove gate oxidation film 3 of the tunnel region portion by means of a wet etching method. Thereafter, to form an n$^-$ region, n-type impurities, for example, arsenic (As), are ion-injected to a density of $1.0 \times 10^{14}$ ions/cm$^2$. The ion injection process in the tunnel region on semiconductor substrate 1 is carried out first, and then the gate oxide film formed on the tunnel region can be etched.

Subsequently, referring to FIG. 7B, after the photoresist is removed, tunnel oxidation film 5 is formed on the tunnel region. Then, first conductive layer 11, for example, a polycrystalline silicon layer, is deposited to a depth of about 2,000 Å. Then, POCl$_3$ is deposited to thereby lower the tunnel oxidation film's sheet resistance to 50 Ω/□. Then, a first conductive layer (not shown in portions P1 of FIGS. 5 and 6A is etched by a photolithographic process, to thereby form a first conductive layer pattern. Subsequently, first polysilicon layer 11 is oxidized and an insulation layer, for example, Si$_3$N$_4$, is thinly deposited on the oxidized first polysilicon layer, thereby forming an ONO film 13. Then, polysilicon layer 15 is deposited to a depth of 2,000 Å in ONO film 13 and the POCl$_3$ is deposited to lower the ONO film'sheet resistance to about 50 Ω/□. Then, a WSi$_2$ 17 is submerged to a depth 1,500 Å to 3,000 Å in polysilicon layer 15, to thereby form a polycide layer (the polysilicon layer plus the silicide layer) 32 being a second conductive layer. Subsequently, to form the gates of the select transistor and the storage transistor, photoresist pattern 18 is formed by way of photolithography. In a subsequent process, when forming a control gate composed of the polycide layer, the floating gate of the storage transistor is automatically self-aligned. Accordingly, when separately forming the floating gate and control gate, the necessary etching process margin does not need to be considered, thereby reducing the distance between the select transistor and the storage transistor to within photolithographic processing limits. Here, reference numeral 9 represents buried n$^+$ layer which is self-aligned by the tunnel region pattern during the step of FIG. 7A.

Figure 7B:
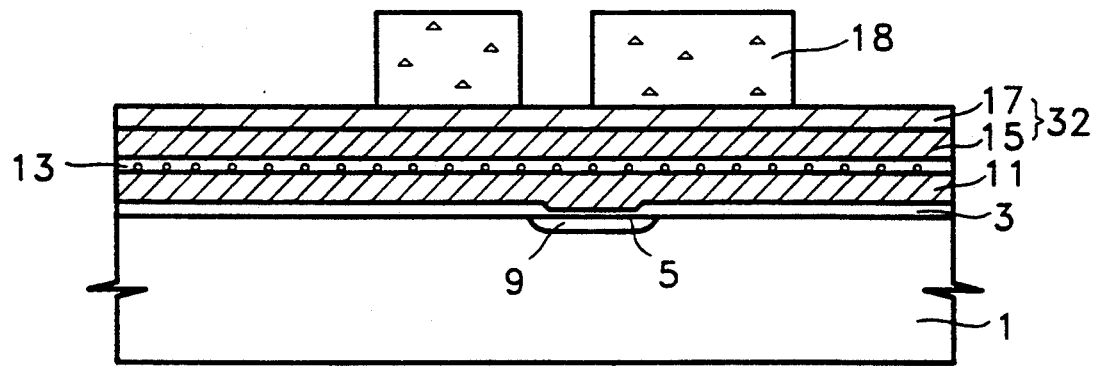
Figure 7C:
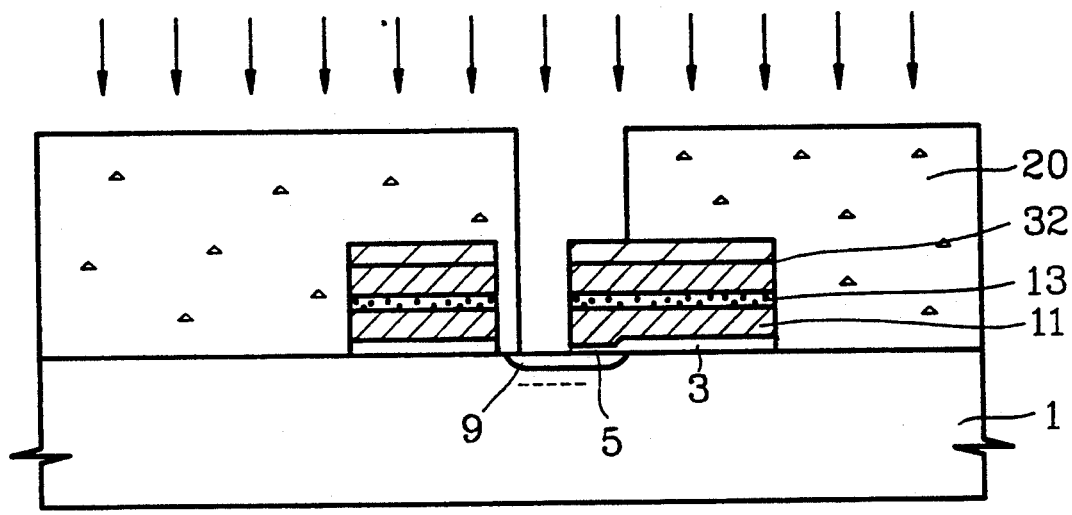

Referring to FIG. 7C, using photoresist pattern 18 of FIG. 7B as the mask, polycide layer 32, ONO film 13 and first polysilicon layer 11 are sequentially etched, thereby forming the gates of the select transistor and the storage transistor. Thereafter, to form a deep junction in the drain region of the storage transistor, photoresist 20 is coated on the overall surface and the coated drain region is patterned as a N+ region pattern of the cell. Then, arsenic (As) is ion-injected in the coated drain region to a density of $6 \times 10^{15}$ ions/cm$^2$.

Figure 7D:
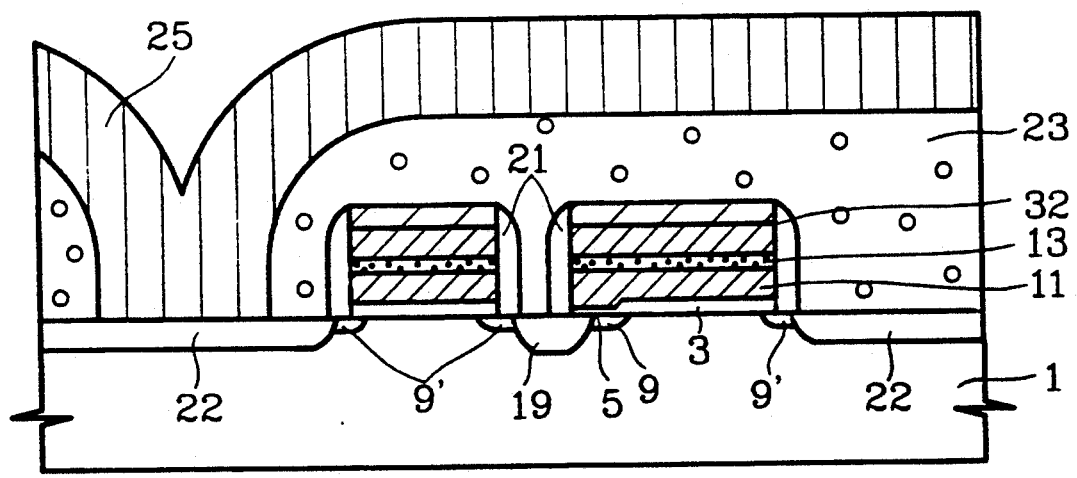

Subsequently, referring to FIG. 7D, after ion-injection is performed for forming the deep junction, heat treatment is performed for forty minutes at a temperature of 975° C. so as to form a deep junction 19. Then, to form a source/drain region having a lightly doped drain (LDD) structure, n-type impurities, for example, phosphorous (P), are ion-injected to a density of $2 \times 10^{13}$ ions/cm$^2$, to form n+ region 9'. Thereafter, oxidation spacer 21 is formed on the side surfaces of the gates of the select transistor and the storage transistor. Then, arsenic (As) is ion-injected to a density of $6 \times 10^{15}$ ions/cm$^2$, to form an n+region 22. Subsequently, intermediate insulation film 23 is formed on the front surface of the above resulted material. Then, to define a bit line contact, a contact hole is formed by applying a contact mask. Then, a metal is deposited on the overall surface of the resultant, to form a bit line 25. Here, the gate of the select transistor is composed of a structure where the first polysilicon layer, the ONO film and the polycide layer are laminated. During the formation of the contact hole, the butted contact of the first polysilicon layer and the polycide layer is formed by the ONO film.

The above process of the butted contact will be described with reference to FIGS. 8A and 8B and FIGS. 9A, 9B and 9C.

Figure 8A:
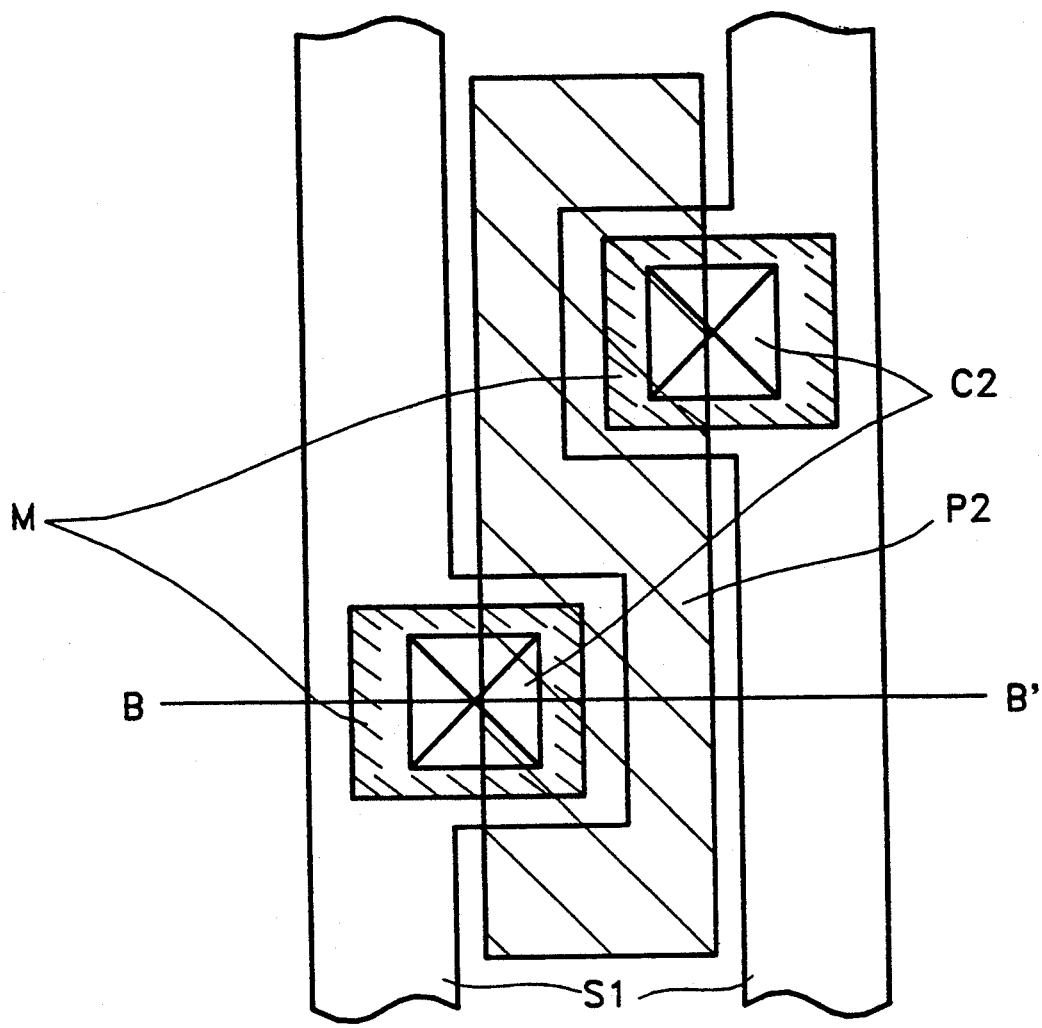
FIGS. 8A and 8B are an enlarged plan view and a cross-sectional view showing a butted contact region shown in FIG. 5, respectively.
Figure 8B:
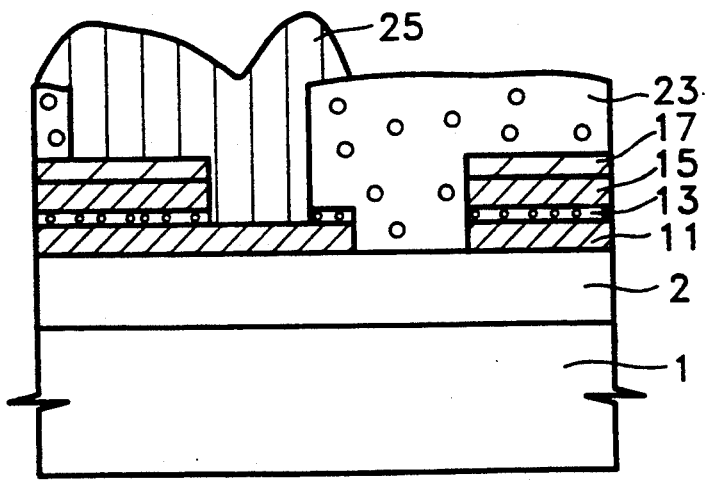

FIG. 8A shows an enlarged view of a portion L defined with a dotted line on the right side in FIG. 5, and FIG. 8B shows a cross-sectional view taken along a line B—B' shown in FIG. 8A. Also, the manufacturing method for realizing the structure shown in FIG. 8B is according to the processing procedure of FIGS. 9A, 9B and 9C.

Figure 9A:
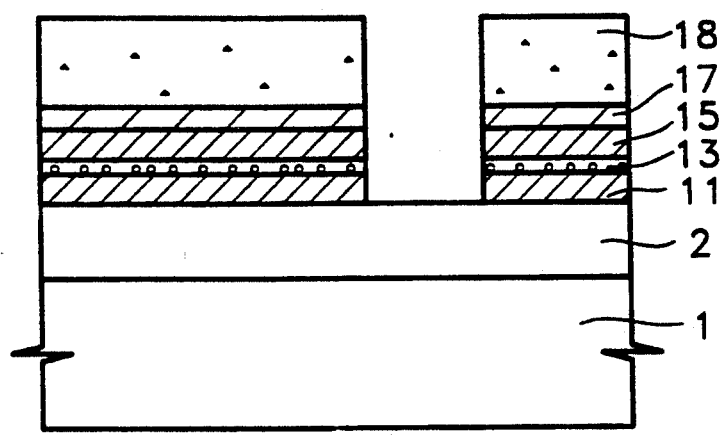
FIGS. 9A, 9B and 9C are cross-sectional views showing a procedure for forming the butted contact of the EEPROM cell according to the present invention.

First, referring to FIG. 9A, first polysilicon layer 11, ONO film 13, second polysilicon layer 15 and the material 17 of WSi$_2$ are sequentially laminated above field oxidation film 2 on semiconductor substrate 1. Thereafter, to form the gates of the select transistor and the storage transistor, photoresist pattern 18 is patterned. Then, using photoresist pattern 18 as a mask, material 17 of WSi$_2$, second polysilicon layer 15, ONO film 13 and first polysilicon layer 11 are sequentially etched (proceeding concurrently with the procedure of FIG. 7B).

Figure 9B:
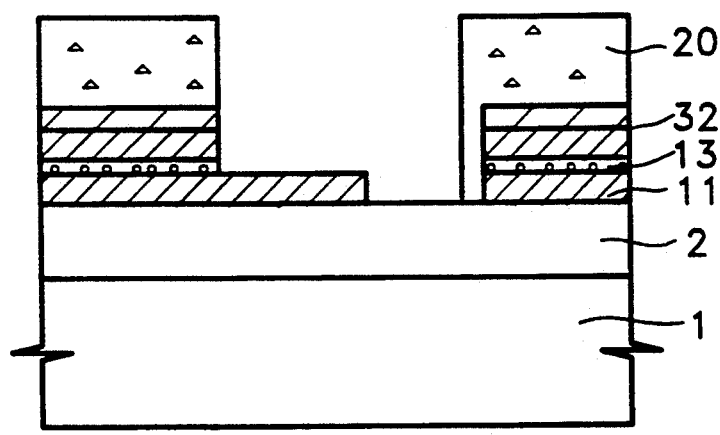

Next, referring to FIG. 9B, after performing the process of FIG. 7C, only those portions to become butted contacts are exposed and the remainder of the cell is coated with photoresist 20. Then, only the exposed polycide 32 of the butted contact portion is etched.

Figure 9C:
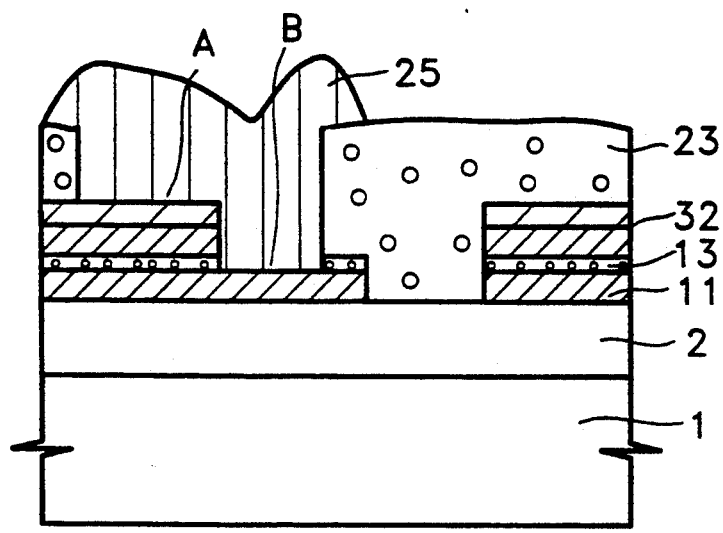

Subsequently, referring to FIG. 9C, the photoresist is removed and then intermediate insulation film 23 is formed. Then, using the contact forming process of FIG. 7D, intermediate insulation film 23 and ONO film 13 are etched, to expose predetermined portions A and B of the polycide layer 32 and the first polysilicon layer. Finally, conductive material 25 is deposited to form a butted contact.

As described above, according to the present invention, the gate of the select transistor is formed as the first conductive layer by way of the self-aligned etching process and the butted contact process. On the other hand, prior to forming the tunnel oxidation film, the buried n+ layer is formed so as to be self-aligned on the tunnel region pattern. Accordingly, the distance between the select transistor and the storage transistor can be reduced to within photolithographic processing limits, thereby realizing the high integration of the EEPROM.

The present invention is not limited in the above embodiment, and may be variously modified within the spirit of the technical concept of the invention.

What is claimed is:

1. A semiconductor memory device, comprising:
   a plurality of non-volatile memory cells each comprised of a storage transistor and a select transistor having respective gate structures separated by a short distance from each other;
   wherein said gate structure of each said storage transistor includes:
   a first layer comprised of a tunneling oxide film and a contiguous first insulating film formed on a surface of a semiconductor substrate;
   a floating gate comprised of a first conductive layer formed on said first insulating layer;
   an second insulating layer formed on said floating gate; and,
   a control gate comprised of a second conductive layer formed on said second insulating layer;
   wherein said gate structure of each said select transistor includes:
   a first insulating layer formed on said surface of said semiconductor substrate;
   a first conductive layer formed on said first insulating layer;
   a second insulating layer formed on said first conductive layer; and,
   a second conductive layer formed on said second insulating layer;
   wherein, in each said non-volatile memory cell, a flank portion of said first conductive layer of said select transistor extends beyond said second insulating layer and said second conductive layer towards said gate structure of said storage transistor; and,
   wherein each of said non-volatile memory cells further includes:
   a first diffusion region formed in said surface of said semiconductor substrate between said respective gate structures of said select transistor and said storage transistor and at least partially beneath said tunneling oxide film of said storage transistor;
   a second diffusion region formed in said surface of said semiconductor substrate adjacent a side of said gate structure of said select transistor opposite from said gate structure of said storage transistor;
   a third diffusion region formed in said surface of said semiconductor substrate adjacent a side of said gate structure of said storage transistor opposite from said gate structure of said select transistor;
   a device insulating layer formed on said surface of said semiconductor substrate and said respective gate structures of said select and storage transistors;
   a first contact hole formed in said device insulating layer to leave a marginal edge portion of an upper surface of said second conductive layer of said select transistor and said flank portion of said first conductive layer of said select transistor uncovered by said device insulating layer; and, a conductive material disposed in said first contact hole to thereby form a butted contact electrically coupling said first and second conductive layers of said select transistor.

2. The memory device as set forth in claim 1, wherein, in said gate structure of said storage transistor of each of said memory cells, said tunneling oxide film has a first thickness and said first insulating film has a second thickness, with said first thickness being less than said second thickness.

3. The memory device as set forth in claim 2, wherein, in each of said memory cells, said first contact hole further leaves a portion of said second diffusion region uncovered by said device insulating layer.

4. The memory device as set forth in claim 3, wherein, in each of said memory cells, said conductive material disposed in said first contact hole is part of a bit line of said memory device.

5. The memory device as set forth in claim 2, wherein each of said memory cells further includes a second contact hole formed in said device insulating layer to leave a portion of said second diffusion region uncovered by said device insulating layer.

6. The memory device as set forth in claim 5, wherein said conductive material in each of said memory cells is also disposed in said second contact hole, to thereby provide a bit line contact electrically coupled to a bit line of said memory device.

7. The memory device as set forth in claim 6, wherein said butted contact of each said memory cell is also electrically coupled to a bit line of said memory device.

8. The memory device as set forth in claim 1, wherein said respective gate structures of said storage and select transistors of each of said memory cells are patterned concurrently.

9. The memory device as set forth in claim 8, wherein, in each of said memory cells, said first layer of said storage transistor and said first insulating layer of said select transistor are patterned from a first common insulating layer.

10. The memory device as set forth in claim 8, wherein, in each of said memory cells, said first conductive layer of said storage transistor and said floating gate of said select transistor are patterned from a first common conductive layer.

11. The memory device as set forth in claim 10, wherein, in each of said memory cells, said second insulating layer of said storage transistor and said second insulating layer of said select transistor are patterned from a common insulating layer.

12. The memory device as set forth in claim 11, wherein, in each of said memory cells, said control gate of said storage transistor and said second conductive layer of said select transistor are patterned from a second common conductive layer.

13. The memory device as set forth in claim 11, wherein, in each of said memory cells, said control gate of said storage transistor and said second conductive layer of said select transistor are each comprised of a two-ply silicide layer.

14. The memory device as set forth in claim 13, wherein, in each of said memory cells, said two-ply silicide layer is comprised of a lower sub-layer of polysilicon and an upper sub-layer of tungsten silicide.

* * * * *